United States Patent [19]
Yoshida et al.

[11] Patent Number: 5,342,475
[45] Date of Patent: Aug. 30, 1994

[54] METHOD OF GROWING SINGLE CRYSTAL OF COMPOUND SEMICONDUCTOR

[75] Inventors: Seikoh Yoshida; Toshio Kikuta, both of Tokyo, Japan

[73] Assignee: The Furukawa Electric Co., Ltd., Tokyo, Japan

[21] Appl. No.: 893,333

[22] Filed: Jun. 3, 1992

[30] Foreign Application Priority Data

Jun. 7, 1991 [JP] Japan ................... 3-163705

[51] Int. Cl.$^5$ ............................................. C30B 21/06
[52] U.S. Cl. .................................. 117/83; 117/953; 117/954; 117/955; 117/939
[58] Field of Search ............... 156/616.1, 616.2, 616.4, 156/616.41

[56] References Cited

U.S. PATENT DOCUMENTS

| | | | |
|---|---|---|---|
| 4,404,172 | 9/1983 | Gault | 422/248 |
| 4,521,272 | 6/1985 | Gault | 156/616.1 |
| 4,840,699 | 6/1989 | Khattak et al. | 156/616.41 |
| 4,853,066 | 8/1989 | Yoshida et al. | 156/616.4 |
| 4,904,336 | 2/1990 | Ozawa et al. | 156/601 |

FOREIGN PATENT DOCUMENTS 2543752 4/1977 Fed. Rep. of Germany.

OTHER PUBLICATIONS

Journal of Crystal Growth 83 (1987) pp. 174–183; "Vertical Gradient Freeze Method To The Growth of Large Diameter, Low Defect Density Indium Phosphide"; Monberg et al.
Journal of Crystal Growth 74 (1986) pp. 491–506, "A Novel Application of the Vertical Gradient Freeze Method to The Growth of High Quality III–V Crystals"; Gault et al.

Primary Examiner—R. Bruce Breneman
Assistant Examiner—Felisa Garrett
Attorney, Agent, or Firm—Frishauf, Holtz, Goodman & Woodward

[57] ABSTRACT

Disclosed is a method of growing a single crystal of a compound semiconductor, in which a compound semiconductor material is loaded in a vertical crucible and the compound semiconductor material is converted into a single crystal by utilizing a seed disposed in the center of the bottom portion of the vertical crucible. The method has the steps of using a crucible having a substantially flat bottom as part of said vertical crucible, producing a melt by melting the compound semiconductor material causing the melt to have a temperature distribution that an isotherm of the melt is convex with a drift toward the melt side, rapidly lowering the temperature of that portion of the melt of the compound semiconductor material which neighbors the seed in the initial stage of the crystal growth to a supercooled state so as to permit a crystal growth from the seed in substantially the horizontal direction without allowing the crystal to grow in a vertical direction to form a crystal of a desired diameter, and solidifying the compound semiconductor material in a molten state while maintaining a temperature gradient that the temperature of the melt gradually uptilts from the lower portion toward the upper portion so as to obtain a single crystal of the compound semiconductor. The particular method permits efficiently growing a single crystal of a large diameter while suppressing a twin generation.

14 Claims, 3 Drawing Sheets

METHOD OF GROWING SINGLE CRYSTAL OF COMPOUND SEMICONDUCTOR

BACKGROUND OF THE INVENTION

1. Field of the Invention

The present invention relates to a method of growing a single crystal of a compound semiconductor.

2. Description of the Related Art

The known technique for vertically growing a single crystal using a crucible includes a Vertical Bridgeman method (VB method) and a Vertical Gradient Freeze method (VGF method). In these known methods, a seed 12 is disposed in the lowermost portion of a crucible 11 accommodating a melt 10 prepared by the heating of a compound semiconductor material with a multi-split heater 13, as shown in FIG. 1. In this case, a temperature gradient is vertically arranged along the melt 10 so that the uppermost portion of the melt 10 has the highest temperature, and the melt temperature gradually decreases toward the lowermost portion in the vicinity of the seed 12, as shown in FIG. 2. Under the condition, the melt crystallizes, starting with the lowermost portion. In the conventional technique, the lower end portion 14 of the crucible is downward tapered, in a funnel-form, in order to suppress the twin generation in the initial stage of the crystal growth. In other words, the diameter in the lower end portion of the crucible gradually converges on the seed 12. Specifically, where an angle Θ shown in FIG. 1, i.e., a set angle between the lower end portion 14 of the crucible 11 and the horizontal line is 54.4°, a (111) facet plane tends to appear in the shoulder portion 15 of the crystal in the case of using a seed having a crystal orientation (001). The presence of the facet plane causes twin boundaries to be generated easily inside the crystal. To cope with the defect, the set angle Θ at the lower end portion of the crucible is reduced to be smaller than 54.4°.

However, in the case of growing a crystal of a large diameter, i.e., 2 inches or more, from the seed portion by the conventional technique outlined above, a twin tends to be frequent in the vicinity of the seed 12. In addition, there is room for further improvement on the conventional technique in respect of a temperature distribution which is to be applied to the crystal within the crucible 11, with the result that it is difficult to obtain a single crystal of a large diameter directly growing from the seed portion.

SUMMARY OF THE INVENTION

An object of the present invention is to provide a method of growing a single crystal of a compound semiconductor, which permits growing a single crystal of a large diameter (2 inches or more) directly from a seed portion.

According to the present invention, there is provided a method of growing a single crystal of a compound semiconductor, in which a compound semiconductor material is loaded in a vertical crucible and the compound semiconductor material is converted into a single crystal by utilizing a seed disposed in the center of the bottom portion of the vertical crucible, the method comprising the steps of:

using a crucible having a substantially flat bottom as the vertical crucible, producing a melt by melting the compound semiconductor material, causing the melt to have a temperature distribution that an isotherm of the melt is convex with a drift toward the melt side, rapidly lowering the temperature of that portion of the melt of the compound semiconductor material which neighbors the seed in the initial stage of the crystal growth to a supercooled state so as to permit a crystal growth from the seed on the substantially horizontal plane without allowing the crystal to grow in a vertical direction until reaching a desired diameter of a crystal; and solidifying the compound semiconductor material in a molten state while maintaining a temperature gradient so that the temperature of the melt gradually uptilts from the lower portion toward the upper portion for the purpose to obtain a single crystal of the compound semiconductor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

Figure 1:
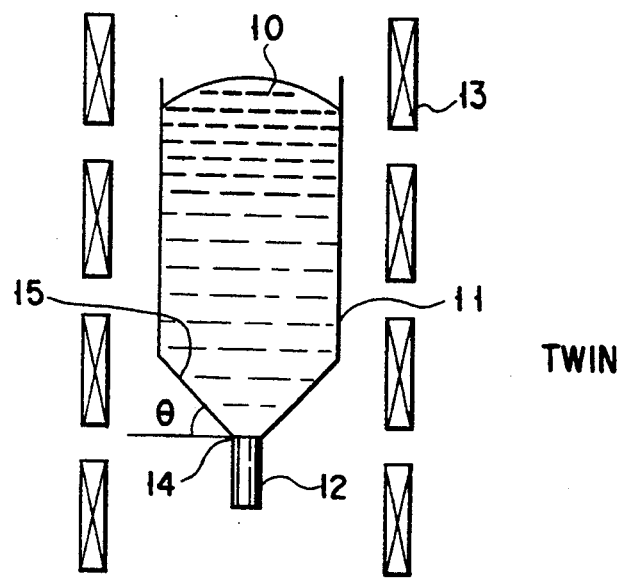
FIG. 1 schematically shows an apparatus used in the conventional method.
Figure 2:
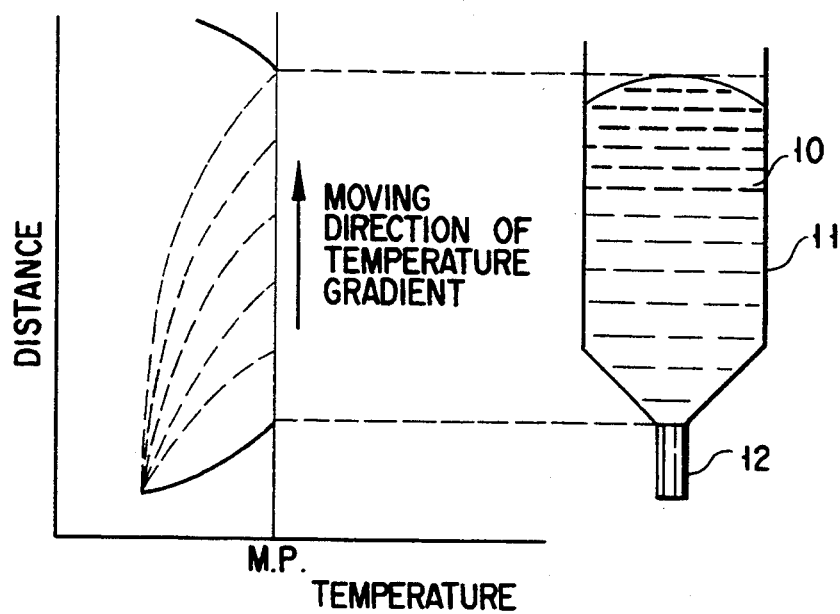
FIG. 2 shows the temperature gradient of the melt within the crucible included in the apparatus shown in FIG. 1.
Figure 3:
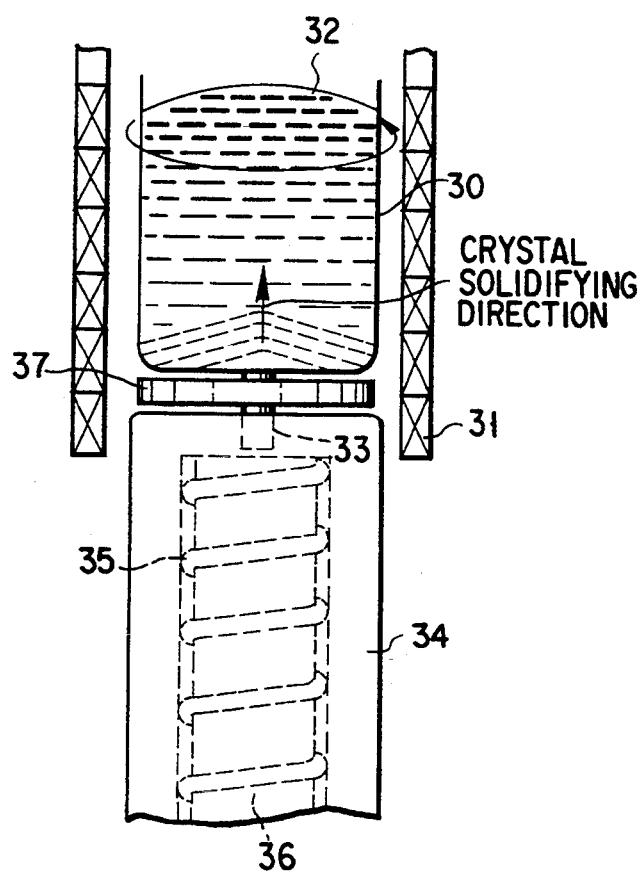
FIG. 3 schematically shows an apparatus used in the method of the present invention.
Figure 4:
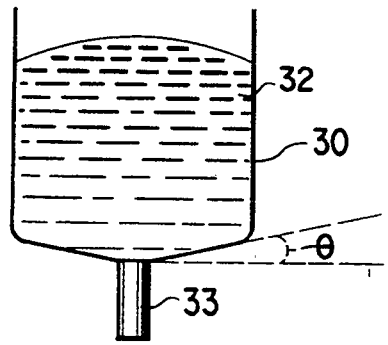
FIG. 4 schematically shows a crucible included in the apparatus used in the method of the present invention.

The accompanying drawings show a method of growing a single crystal according to one embodiment of the present invention. In this embodiment, a single crystal of a compound semiconductor InP is grown by a vertical Gradient Freeze method. FIG. 3 shows an apparatus used in this embodiment. As shown in FIG. 3, the apparatus comprises a substantially cylindrical crucible 30 with an end. It is desirable for the bottom plane of the crucible 30 to have a certain angle Θ, which, as shown in FIG. 4, falls within a range of between −10° and +10° with the horizontal plane, i.e., $-10° \leq \Theta \leq +10°$. The crucible 30 has a diameter of about 2 inches in view of the desired diameter of the single crystal which is to be obtained.

A multi-split heater 31 is wound about the outer circumferential surface of the crucible 30. Loaded in the crucible 30 is a raw material 32, i.e., about 1.2 kg of polycrystalline InP. An InP seed 33 having a crystal orientation (100) is disposed in the central portion at the bottom plane of the crucible 30. The lower end portion of the InP seed 33 is inserted into the upper portion of a heat sink 34 composed of carbon having a high heat conductivity. A tool 36 composed of carbon and wound with a pipe 35 for a cooling medium is built in the heat sink 34. The presence of the heat sink 34 facilitates dissipation of heat from the InP seed 33. It is possible to use, for example, an inert gas such as $N_2$ gas or Ar gas as well as water as the cooling medium which is circulated through the pipe 35. The flow rate of the cooling medium is controlled appropriately by a flow rate control means (not shown).

The diameter of the heat sink 34 is set larger than the diameter of the crucible 30. An adiabatic plate 37 having low thermal conductivity and composed of, for example, a heat insulator made of $Al_2O_3$ or $SiO_2$ is disposed between the crucible 30 and the heat sink 34 except for the region of the InP seed 33. As a result, heat is effectively released from the InP seed 33 into the heat sink 34. Incidentally, the system shown in FIG. 3 is disposed within a high pressure vessel (not shown).

Figure 5:
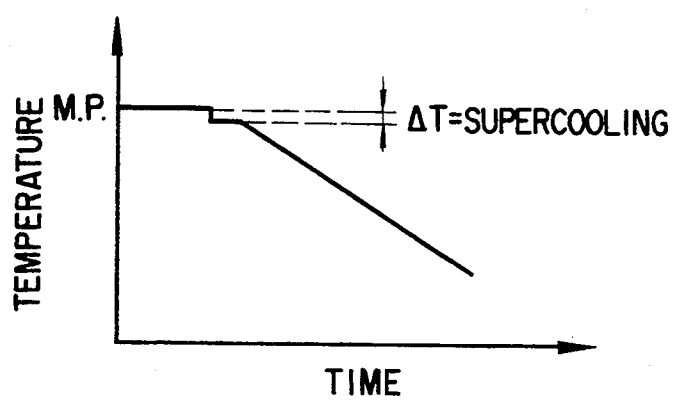
FIG. 5 is a graph showing the relationship between the temperature and time in the upper end portion of a seed.
Figure 6:
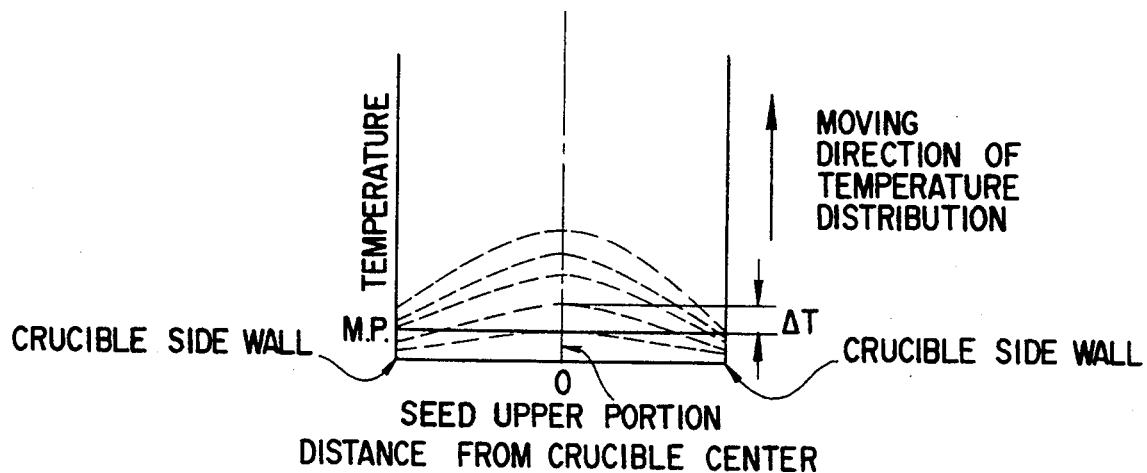
FIG. 6 schematically shows the movement in the temperature distribution in the width direction of the crucible in the vicinity of the seed.

In the apparatus of the construction described above, the raw material 32 of polycrystalline InP is heated to a temperature higher than the melting point of InP, which is 1062° C. For example, the raw material 32 is heated to 1070° C. so as to melt the raw material of polycrystalline InP, as keeping the temperature of the InP seed 33 below the melting point so as to prevent the InP seed 33 from melting. When the raw material 32 of polycrystalline InP has been uniformly melted, the heater included in the multi-split heater 31, which is positioned in the proximity to the InP seed 33, is controlled so that the temperature of that region of the melt adjacent to the InP seed, i.e., the region in a depth of about 1 cm from the upper surface of the InP seed, is rapidly lowered by $\Delta T$, as shown in FIG. 5. The InP seed is brought under a supercooled state due to the temperature drop noted above. In this case, the value of $\Delta T$ ought to be set at 6° to 10° C. If $\Delta T$ is higher than 10° C., polycrystal is instantaneously generated since the supercooling surges. If $\Delta T$ is lower than 6° C., the crystal is inapt to fully solidify since the supercooling is inactive. FIG. 6 shows the temperature distribution of the melt within the crucible in the width direction of the crucible. As seen from the drawing, a temperature distribution shows a convex shape, as in FIG. 6. In other words, an isotherm of the melt is convex with a drift toward the melt side.

Figure 7:
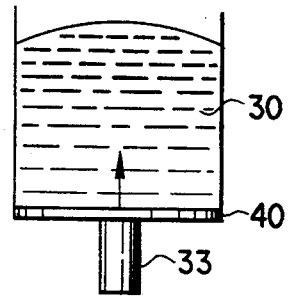
FIG. 7 schematically shows the initial stage of crystal growth achieved in the method of the present invention.

The supercooling described above permits a crystal growth in the lateral direction, i.e., in the width direction of the crucible, on the bottom surface of the crucible 30. To be more specific, a slice-form crystal is instantaneously grown within a region in a depth of about 1 cm from the upper surface of the InP seed so as to form a crystal head portion 40 of a large diameter on a par level with the diameter at the bottom of the crucible, as shown in FIG. 7. It is remarkable that no twin boundaries will arise in the crystal head portion 40 thus formed.

Figure 8:
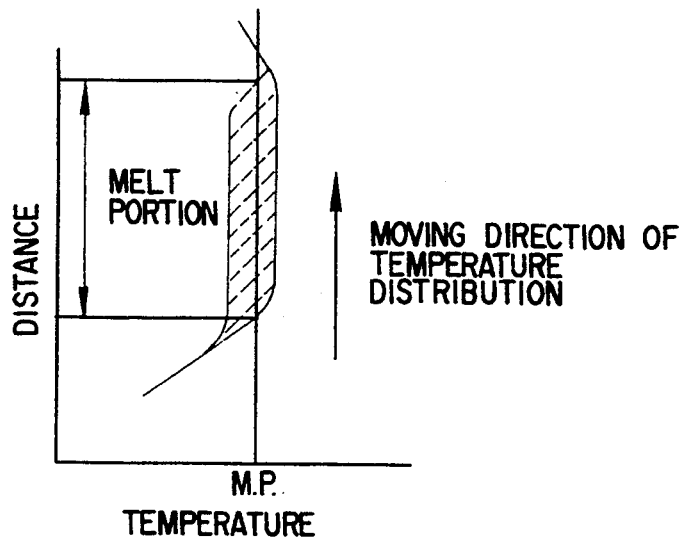
FIG. 8 is a graph showing the direction of movement of the temperature distribution in the stage of the crystal growth.

The crystal head portion thus formed continues growing within the crucible 30 as denoted by dotted lines in FIG. 3. When the crystal has grown to reach the upper end portion of the crucible 30, the crucible 30 is cooled from the bottom so as to produce the single crystal thus grown. The cooling is carried out by controlling the multi-split heater 31 so that the crucible can be cooled from the lower portion, while maintaining the lower portion of the melt within the crucible at a predetermined temperature gradient (5° to 15° C./cm), as shown in FIG. 8. The temperature gradient ought to fall within a range between 5° and 15° C./cm. If $\Delta T$ exceeds 15° C./cm, a dendrite crystal is generated. If $\Delta T$ is lower than 5° C./cm, an isotherm of the melt can hardly form a convex shape because of the thermal perturbation of the melt, and it becomes hard to grow a single crystal. In the cooling process, the predetermined temperature gradient curve is moved upward from the lower portion of the melt. For achieving a satisfactory cooling in this fashion, it is insufficient to use the multi-split heater 31 alone. In addition to the control performed by the multi-split heater 31, it is necessary to increase sufficiently the heat dissipation from the heat sink 34. In the present invention, the flow rate of the cooling medium flowing within the pipe 35 within the heat sink 34 is increased so as to increase the heat dissipation performed by the heat sink 34. The particular technique of the present invention permits growth of InP single crystal having such a large diameter as 2 inches or more without twin generation.

In the embodiment described above, the temperature of the melt in the vicinity of the seed is rapidly lowered to a supercooled state for achieving a crystal growth from the seed in the lateral direction. Alternatively, it is possible to rotate the crucible so as to rapidly lower the temperature of the melt in the vicinity of the seed. In this case, the crystal can be grown laterally from the seed more easily. To be more specific, the rotation of the crucible causes the temperature in the central portion of the melt to be lowered, with the result that the convex temperature distribution of the melt as shown in FIG. 6 becomes sharper. The convex curve increases in sharpness, as the speed increases in rotation of the crucible. Where the convex curve denoting the temperature distribution is sharpened, the crystal can be laterally grown easily in the bottom portion of the crucible by rapidly lowering the melt temperature by only 3° to 4° C. Where the crucible rotation and the rapid temperature drop are employed in combination, it is possible to achieve growth of a single crystal having a diameter as large as 3 to 4 inches.

In the embodiment described above, a Vertical Gradient Freeze method is employed for growing a single crystal. In addition, the technical idea of the present invention can be employed for growing a single crystal by a vertical Bridgeman method. In this method, supercooling is applied to a molten polycrystalline raw material so as to achieve crystal growth in the lateral direction in the bottom portion of the crucible, which is, thereafter, moved downward along with the heat sink at a predetermined speed so as to obtain a single crystal of a compound semiconductor.

Further, InP is used as a compound semiconductor in the embodiment described above. However, it is also possible to use some other compound semiconductors such as GaAs, InAs, GaSb and GaP so as to obtain a single crystal of a large diameter.

As described above in detail, the present invention provides a method of growing a single crystal of a compound semiconductor. In the present invention, a crystal head portion of a large diameter is formed in the initial stage of the crystal growth, making it possible to suppress a twin generation and to grow efficiently a single crystal of a large diameter.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of growing a single crystal of a compound semiconductor, in which a compound semiconductor material is loaded in a vertical crucible and the compound semiconductor material is converted into a single crystal by utilizing a seed disposed in the center of the bottom portion of the vertical crucible, said method comprising the steps of:

using a crucible having a substantially flat bottom as said vertical crucible, said flat bottom having a central portion at an angle $\Theta$ falling within a range between $-10°$ and $+10°$ with a horizontal plane, producing a melt by melting the compound semiconductor material, causing said melt to have a temperature distribution such that an isotherm of said melt is convex with a drift toward the melt side, rapidly lowering the temperature by 6° to 10° C. of that portion of the melt of the compound semiconductor material which is proximate to and in the vicinity of said seed in the initial stage of the crystal growth to a supercooled state so as to permit a crystal growth from said seed on the substantially horizontal plane without allowing the crystal to grow in a vertical direction, until reaching a desired diameter of a crystal; and crystallizing the compound semiconductor material in a molten state while maintaining a temperature gradient such that the temperature of said melt is gradually increased from the lower portion toward the upper portion so as to obtain a single crystal of the compound semiconductor.

2. The method of growing a single crystal of a compound semiconductor according to claim 1, wherein said temperature gradient falls within a range between 5° C./cm and 15° C./cm.

3. The method of growing a single crystal of a compound semiconductor according to claim 1, further comprising the step of dissipating heat from a lower end portion of the seed when growing said single crystal.

4. The method of growing a single crystal of a compound semiconductor according to claim 3, wherein said heat dissipating step is performed by using a heat sink.

5. The method of growing a single crystal of a compound semiconductor according to claim 1, wherein said compound semiconductor material is a material selected from the group consisting of InP, GaAs, InAs, GaSb and GaP.

6. The method of growing a single crystal of a compound semiconductor according to claim 1, wherein growing process for said single crystal is carried out by a method selected from the group consisting of a Vertical Gradient Freeze method and a Vertical Bridgeman method.

7. A method of growing a single crystal of a compound semiconductor, in which a compound semiconductor material is loaded in a vertical crucible and the compound semiconductor material is converted into a single crystal by utilizing a seed disposed in the center of the bottom portion of the vertical crucible, said method comprising the steps of:

using a crucible having a substantially flat bottom as said vertical crucible, said flat bottom having a central portion at an angle $\Theta$ falling within a range between $-10°$ and $+10°$ with a horizontal plane, producing a melt by melting the compound semiconductor material, causing said melt to have a temperature distribution such that an isotherm of said melt is convex with a drift toward the melt side, rapidly lowering the temperature by 3° to 4° C. of that portion of the melt of the compound semiconductor material which is proximate to and in the vicinity of said seed in the initial stage of the crystal growth to a supercooled state so as to permit a crystal growth from said seed on the substantially horizontal plane without allowing the crystal to grow in a vertical direction, until reaching a desired diameter of a crystal;

crystallizing the compound semiconductor material in a molten state while maintaining a temperature gradient such that the temperature of said melt is gradually increased from the lower portion toward the upper portion so as to obtain a single crystal of the compound semiconductor; and rotating said vertical crucible during a growing process for said single crystal.

8. The method of growing a single crystal of a compound semiconductor according to claim 7, wherein said temperature gradient falls within a range between 5° C./cm and 15° C./cm.

9. The method of growing a single crystal of a compound semiconductor according to claim 7, further comprising the step of dissipating heat from a lower end portion of the seed when growing said single crystal.

10. The method of growing a single crystal of a compound semiconductor according to claim 9, wherein said heat dissipating step is performed by using a heat sink.

11. The method of growing a single crystal of a compound semiconductor according to claim 7, wherein said compound semiconductor material is a material selected from the group consisting of InP, GaAs, InAs, GaSb and GaP.

12. The method of growing a single crystal of a compound semiconductor according to claim 7, wherein growing process for said single crystal is carried out by a method selected from the group consisting of a Vertical Gradient Freeze method and a Vertical Bridgeman method.

13. The method of growing a single crystal of a compound semiconductor according to claim 8, wherein the vicinity of the seed is a region in a depth of about 1 cm from an upper surface of the seed.

14. The method of growing a single crystal of a compound semiconductor according to claim 2, wherein the vicinity of the seed is a region in a depth of about 1 cm from an upper surface of the seed.

* * * * *